United States Patent
Radens et al.

(10) Patent No.: US 11,038,106 B1
(45) Date of Patent: Jun. 15, 2021

(54) PHASE CHANGE MEMORY CELL WITH A METAL LAYER

(71) Applicant: INTERNATIONAL BUSINESS MACHINES CORPORATION, Armonk, NY (US)

(72) Inventors: Carl Radens, LaGrangeville, NY (US); Kangguo Cheng, Schenectady, NY (US); Juntao Li, Cohoes, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/691,646

(22) Filed: Nov. 22, 2019

(51) Int. Cl.
*H01L 45/00* (2006.01)

(52) U.S. Cl.
CPC ........ *H01L 45/126* (2013.01); *H01L 45/1683* (2013.01); *H01L 45/06* (2013.01); *H01L 45/1233* (2013.01)

(58) Field of Classification Search
CPC ... H01L 45/06; H01L 45/065; H01L 45/1233; H01L 45/126; H01L 45/1273
See application file for complete search history.

(56) References Cited

U.S. PATENT DOCUMENTS

| | | | |
|---|---|---|---|
| 6,566,700 B2 | 5/2003 | Xu | |
| 6,972,430 B2 | 12/2005 | Casagrande | |
| 7,835,177 B2 | 11/2010 | Hsu | |
| 7,910,911 B2 | 3/2011 | Breitwisch | |
| 7,915,602 B2 | 3/2011 | Sato | |
| 8,728,856 B2 | 5/2014 | Pio | |
| 9,123,415 B2 | 9/2015 | Liu | |
| 2003/0189200 A1* | 10/2003 | Lee | H01L 45/1233 257/1 |

(Continued)

FOREIGN PATENT DOCUMENTS

| | | |
|---|---|---|
| CN | 101640251 A | 2/2010 |
| CN | 203871379 U | 10/2014 |

OTHER PUBLICATIONS

Bahl et al., "Programming Current Reduction via Enhanced Asymmetry-Induced Thermoelectric Effects in Vertical Nanopillar Phase-Change Memory Cells", IEEE Transactions on Electron Devices, Dec. 2015, vol. 62, No. 12, pp. 4015-4021.

(Continued)

*Primary Examiner* — Robert G Bachner
*Assistant Examiner* — Molly K Reida
(74) *Attorney, Agent, or Firm* — Ewa M. Wozniak

(57) ABSTRACT

A method may include filling a via opening with a spacer, the via opening formed in a dielectric layer, forming a trench within the spacer, filling the trench with a metal layer, recessing the spacer to form an opening and expose an upper portion of the metal layer, wherein the exposed portion of the metal layer is formed into a cone shaped tip, conformally depositing a liner along a bottom and a sidewall of the opening and the exposed portion of the metal layer, depositing a second dielectric layer along the bottom of the opening on top of the liner, recessing the liner to form a channel and partially exposing a sidewall of the second dielectric layer and a sidewall of the metal layer, depositing a third dielectric layer in the channel, and depositing a phase change memory layer within the opening.

15 Claims, 9 Drawing Sheets

(56) References Cited

U.S. PATENT DOCUMENTS

| | | | |
|---|---|---|---|
| 2009/0032793 A1* | 2/2009 | Lai | H01L 45/1273 |
| | | | 257/4 |
| 2009/0218557 A1* | 9/2009 | Sato | H01L 45/144 |
| | | | 257/3 |
| 2010/0163828 A1 | 7/2010 | Tu | |
| 2011/0053335 A1 | 3/2011 | Sasaki | |
| 2012/0068147 A1 | 3/2012 | Chuang | |

OTHER PUBLICATIONS

Chapuis et al., "Heat transfer between a nano-tip and a surface", Nanotechnology, vol. 17, No. 12, arXiv:0802.1969v1 [cond-mat.mtrl-sci] Feb. 14, 2008, pp. 1-8.

Li et al., "Structure Effect of Cylindrical-Shaped GeSbTe Alloy on Phase Transition in Phase Change Memory", 2008 8th IEEE Conference on Nanotechnology, Year: 2008, Conference Paper, Publisher: IEEE, pp. 350-353.

\* cited by examiner

PHASE CHANGE MEMORY CELL WITH A METAL LAYER

BACKGROUND

The present invention relates generally to a phase change memory cell, and more particularly, to a method and structure for forming a phase change memory cell with a metal layer.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

To facilitate a change from the crystalline phase to the amorphous phase, an electrical energy, such as a voltage pulse, may be applied to one of the electrodes, for example a bottom electrode, causing the phase change material at the electrode, or substantially in the vicinity thereof, to heat above its melting temperature. The phase change material is then rapidly cooled below its glass temperature. The phase change material that is treated in this way is transformed from the crystalline phase to the amorphous phase. An amorphized area is created in the phase change material where such a phase transition has occurred.

The size of the amorphized area corresponds to the molten area created by the melting of the phase change material, and is dependent on the magnitude of the applied voltage. Where the phase change memory cell is designed to have a relatively high resistive area, a larger voltage drop and a higher temperature will occur compared to other areas of the phase change memory cell, resulting in the creation of a so-called hotspot in the phase change material at such an area.

SUMMARY

According to one embodiment of the present invention, a method is provided. The method may include filling a via opening with a spacer, the via opening formed in a dielectric layer, forming a trench within the spacer, filling the trench with a metal layer, recessing the spacer to form an opening and expose an upper portion of the metal layer, wherein the exposed portion of the metal layer is formed into a cone shaped tip, conformally depositing a liner along a bottom and a sidewall of the opening and the exposed portion of the metal layer, depositing a second dielectric layer along the bottom of the opening on top of the liner, recessing the liner to form a channel and partially exposing a sidewall of the second dielectric layer and a sidewall of the metal layer, depositing a third dielectric layer in the channel, a top surface of the third dielectric layer being substantially flush with a top surface of the second dielectric layer, and depositing a phase change memory layer within the opening, wherein a top surface of the metal layer is in direct contact with a bottom surface of the phase change memory layer. The method may include forming a bottom electrode in a substrate, wherein the metal layer is formed above and in electrical contact with the bottom electrode and forming a top electrode on top of the phase change memory layer. The bottom portion of the metal layer may have a larger diameter than a top portion of the metal layer. The spacer may have a different etch rate than the metal layer. The second dielectric layer may have a different etch rate than the third dielectric layer.

According to another embodiment of the present invention, a method is provided. The method may include forming a metal layer in an opening, the metal layer comprising a top portion and a bottom portion, the top portion comprising a cone shaped tip, protecting the metal layer such that the bottom portion of the metal layer is surrounded by a metal material and only the cone shaped tip is exposed, and forming a phase change memory layer within the opening, the phase change memory layer being in direct contact with the exposed portion of the cone shaped tip of the metal layer.

According to another embodiment of the present invention, a structure is provided. The structure may include a metal layer, wherein a top portion of the metal layer is a cone shaped tip, a liner partially formed at a sidewall of the metal layer, a top surface of the liner is below a top surface of the cone shaped tip, a third dielectric layer, the third dielectric layer is above the liner, a top surface of the third dielectric layer is below the top surface of the cone shaped tip of the metal layer, and a phase change memory layer, wherein the cone shaped tip of the metal layer is in direct contact with the phase change memory layer. The structure may include a second dielectric layer, a top portion of the second dielectric layer is surrounded by the third dielectric layer and a bottom portion of the second dielectric layer is surrounded by the liner. The structure may include a first electrode below and in electrical contact with the metal layer, and a second electrode above and in electrical contact with the phase change memory layer. The structure may also include a spacer, the spacer surrounding a bottom portion of the metal liner, wherein the spacer has a different etch rate than the metal layer. The structure may include a second dielectric layer, wherein a top portion of the second dielectric layer is surrounded by the third dielectric layer and a bottom portion of the second dielectric layer is surrounded by the liner, wherein the second dielectric layer has a different etch rate than the liner.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
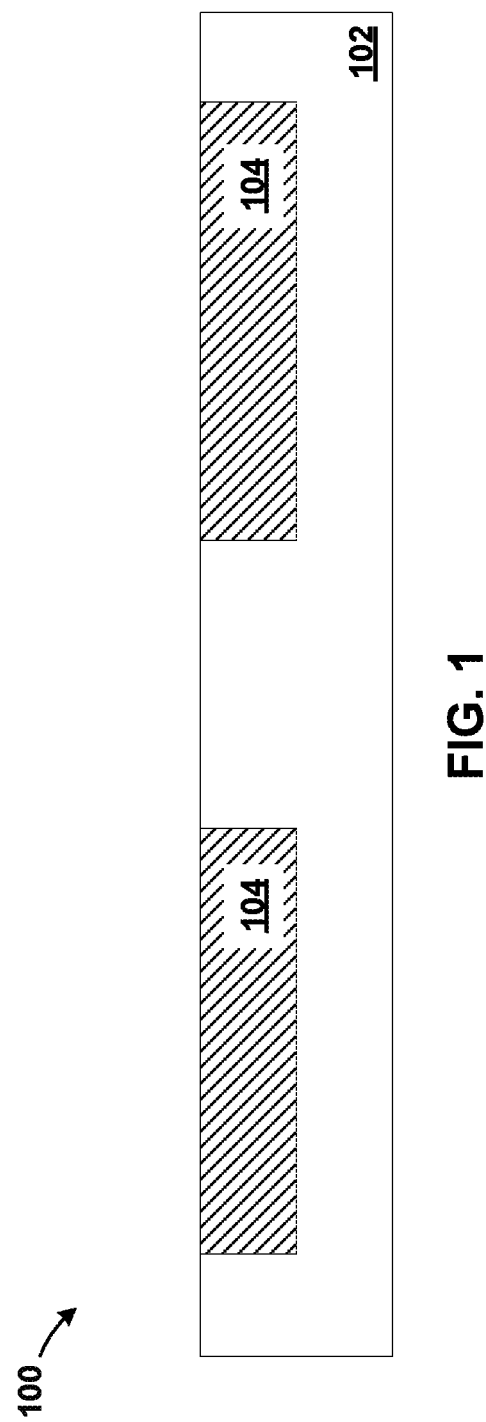
FIG. 1 is a cross section view illustrating forming of a bottom electrode in an underlayer according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In a phase change memory cell, a phase change material is formed between two electrodes. Typically, a conventional phase change memory cell includes a heater which may be located either over the phase change material or under the phase change material. The location of the heater in a conventional phase change memory cell may limit the heating efficiency due to slow thermal dissipation. As such, a new integration approach is needed to reduce the reset current of the phase change memory cell. Embodiments of the present invention generally relate to a phase change memory cell, and more particularly, to a method and structure for forming a phase change memory cell with a metal layer having a sharp tip.

Referring now to FIG. 1, a structure 100 is shown, in accordance with an embodiment. The structure 100 may include an underlayer 102 and bottom electrodes 104. The bottom electrodes 104 may also be referred to as first electrodes. Although two bottom electrodes 104 are shown, it should be appreciated that embodiments of the present invention may include any number of bottom electrodes 104. The bottom electrodes 104 may be formed of a conductive material, such as, for example, copper, tungsten, cobalt, or aluminum, to allow for current to pass through the bottom electrodes 104. The bottom electrodes 104 may be parallel metal lines and serve as word lines or bit lines. The underlayer 102 may be a silicon substrate with connections and structures, such as, for example, transistors, interconnects and isolations built on it.

Figure 2:
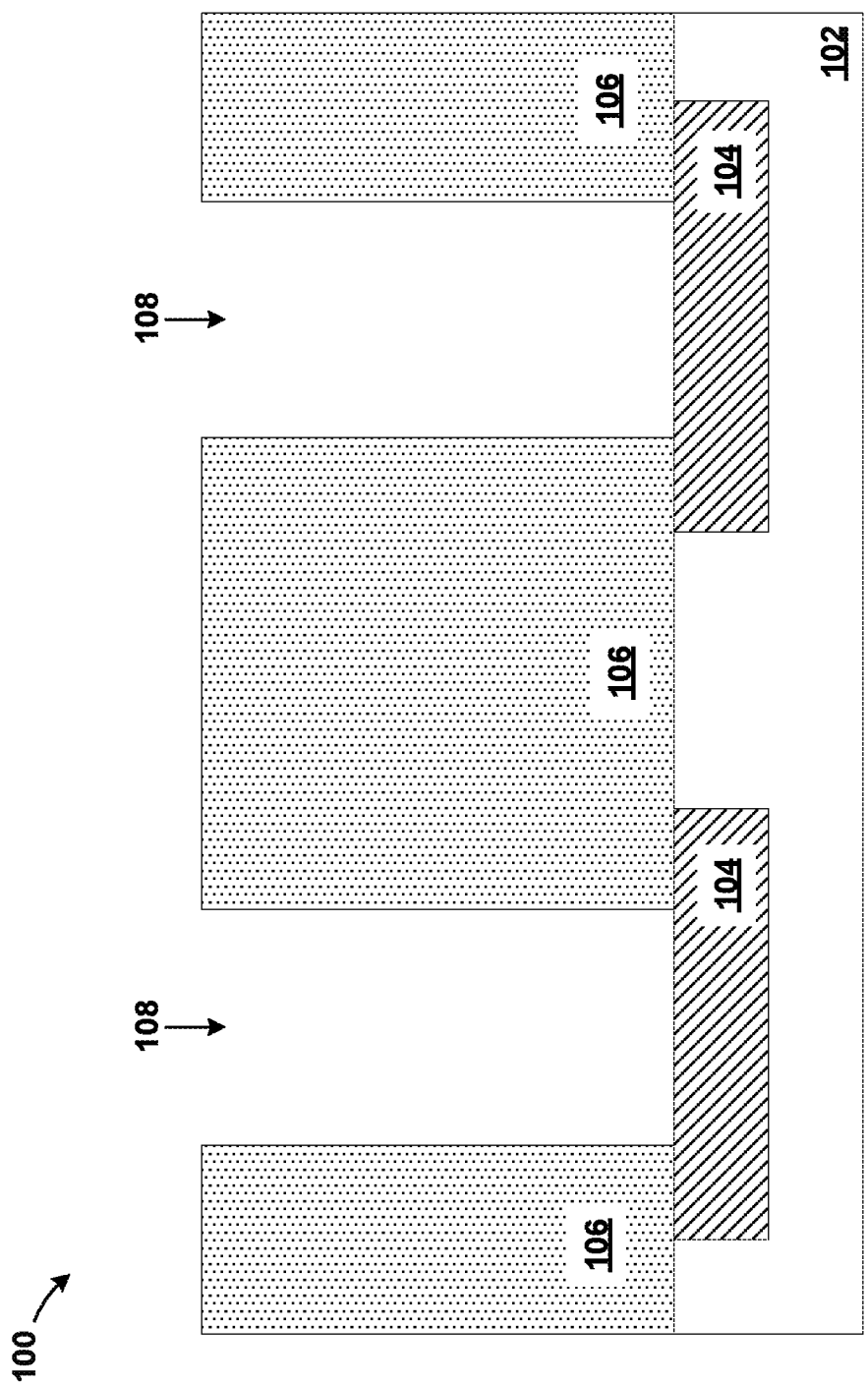
FIG. 2 is a cross section view illustrating depositing of a dielectric layer and forming via openings according to an exemplary embodiment.

Referring now to FIG. 2, the structure 100 with a first dielectric layer 106 is shown, in accordance with an embodiment. The first dielectric layer 106 may be deposited on top of the bottom electrodes 104 and the underlayer 102. The first dielectric layer 106 may be made of any suitable dielectric material, such as, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the first dielectric layer 106.

Once the first dielectric layer 106 is deposited, the first dielectric layer 106 may be patterned, using known techniques to create via openings 108. The via openings 108 are patterned in the first dielectric layer 106 to a size that allows for the via openings 108 to be subsequently filled with a series of layers, as described below with reference to FIG. 3. In an embodiment, the via openings 108 may be patterned to a smallest lithography size. Although two via openings 108 are illustrated in FIG. 2, it should be appreciated that embodiments of the present invention may include any number of via openings 108. In an embodiment of the invention, the number of via openings 108 may correspond to the number of bottom electrodes 104. For example, if there are four bottom electrodes 104, there may be four via openings 108 patterned in the first dielectric layer 106. Alternatively, multiple via openings 108 may be patterned above a single bottom electrode 104.

The via openings 108 are patterned in the first dielectric layer 106 thereby exposing top surfaces of the bottom electrodes 104. As a result, the via openings 108 may extend from the top of the first dielectric layer 106 to the bottom of the first dielectric layer 106. However, both the bottom electrodes 104 and the underlayer 102 are intact and are not affected by the dielectric layer patterning. The structure 100, as illustrated in FIG. 2, may include the underlayer 102, the bottom electrodes 104 and the first dielectric layer 106 patterned to form the via openings 108.

Figure 3:
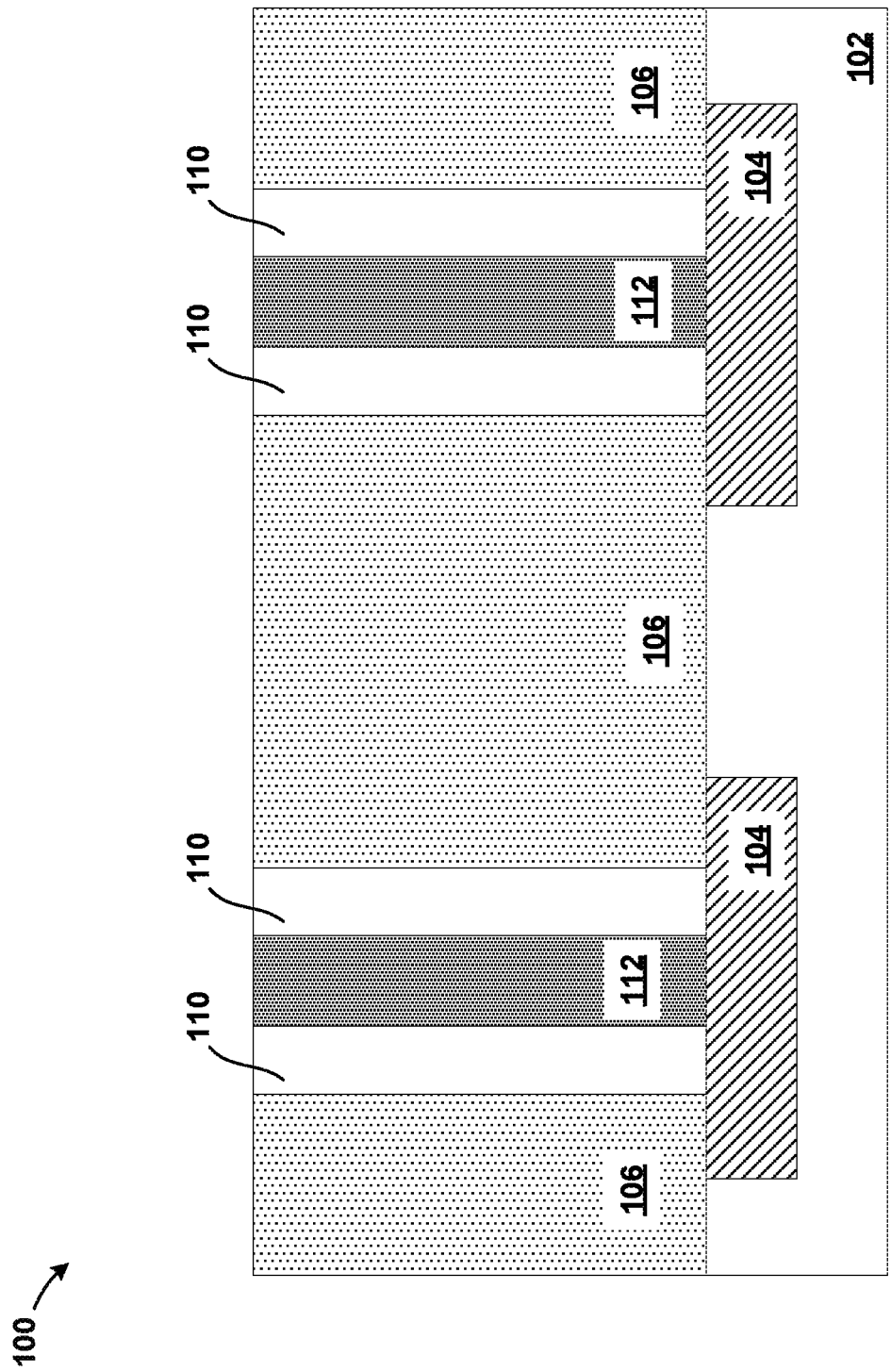
FIG. 3 is a cross section view illustrating filling the via openings with spacers and metal fill according to an exemplary embodiment.

Referring now to FIG. 3, the structure 100 with spacers 110 and metal layers 112 is shown, in accordance with an embodiment. Once the via openings 108 are patterned in the first dielectric layer 106, the via openings 108 are filled with spacer material using known deposition techniques, such as, for example, atomic layer deposition. An example of the spacer material may be, but is not limited to, silicon nitride, either alone or in combination with any other suitable spacer material. Once the spacer material is deposited, an etch process, such as, for example, anisotropic etch process is used to etch trenches within the spacer material exposing the top surface of the bottom electrodes 104 thereby creating the spacers 110.

The etch process removes portions of the spacer material deposited at horizontal surfaces, forming the spacers 110 at sidewalls and creating trenches in between the spacers 110. These trenches are subsequently filled with a metal fill forming the metal layers 112. The metal layers 112 are surrounded by the spacers 110. The spacers 110 are made of materials that have low thermal conductivity. As a result, the spacers 110 function as insulators. The spacers 110 allow for the current to be contained within the metal layers 112.

The metal layers 112 may be made of any suitable conductive metal, such as, for example, tungsten or titanium nitride. The metal layers 112 connect to the bottom electrodes 104 such that the top portion of the bottom electrodes 104 are in direct contact with the bottom portions of the metal layers 112. As a result, a current conducting path allows for the current to flow from the bottom electrodes 104 into the metal layers 112.

The metal layers 112 are also made of materials that have different etch rates than the materials that make up the spacers 110. In an embodiment, the metal layers 112 are made of material that has a slower etch rate than the sacrificial spacer material that makes up the spacers 110.

Figure 4:
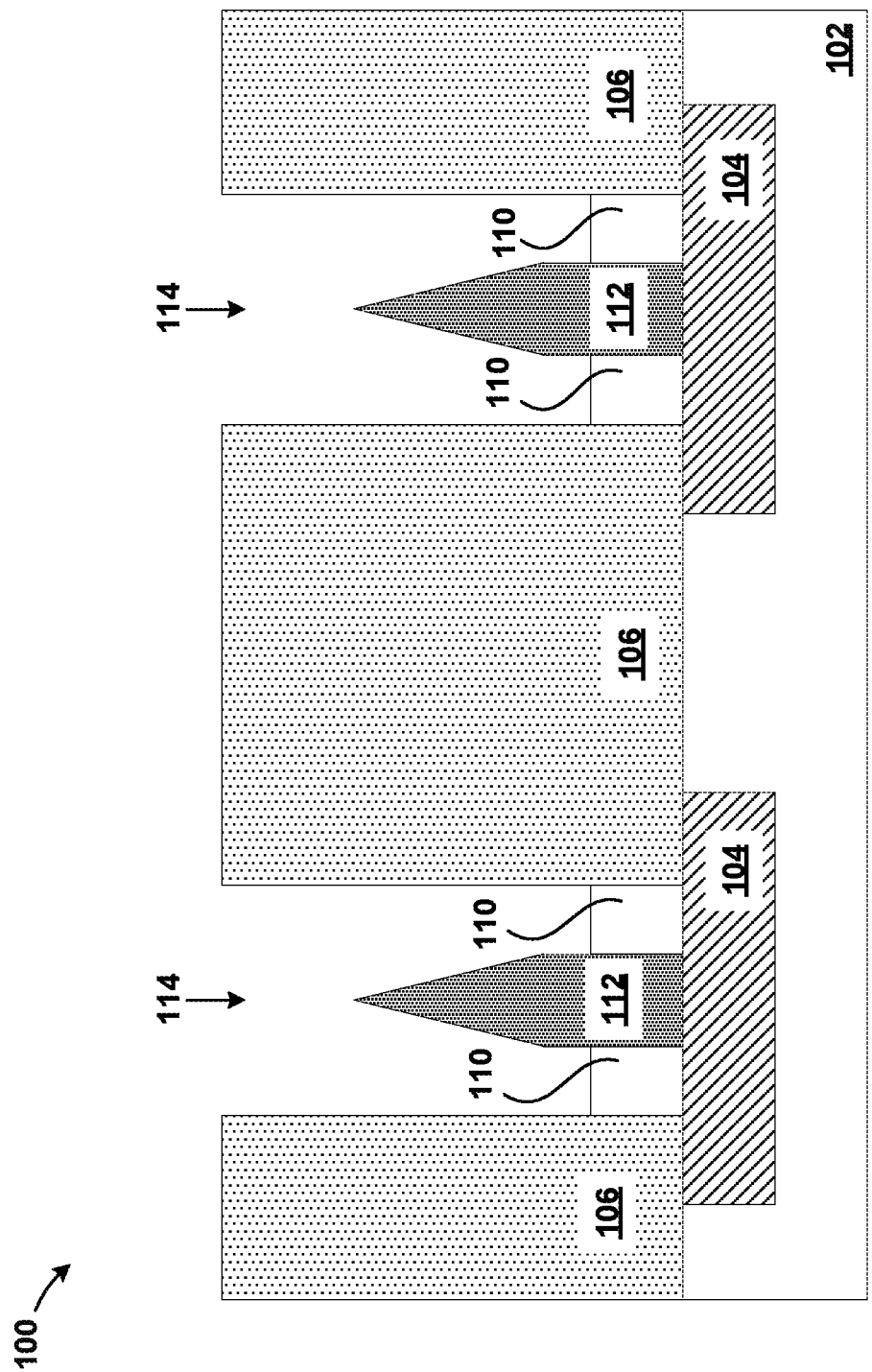
FIG. 4 is a cross section view illustrating recessing the spacers and the metal fill according to an exemplary embodiment.

Referring now to FIG. 4, the structure 100 with openings 114 are shown, in accordance with an embodiment. The spacers 110 is recessed to expose upper portions of the metal layers 112 by undergoing an etch process, such as, for example, an isotropic etch process to form the openings 114. Since the spacers 110 are made of material that has a faster etch rate than the metal forming the metal layers 112, the spacers 110 are recessed more than the metal layers 112. In addition, because of the different etch rates, during the etch process, the metal layers 112 are recessed such that the top portions of the metal layers 112 transform into sharp tips. The spacers 110 are recessed such that a portion of the spacers 110 remains and surrounds the bottom portion of the metal layers 112.

The etching of the spacers 110 creates the metal layers 112 whose bottom portions have a larger circumferential diameter than the top portions. In addition, the top portion of the metal layers 112 are formed into sharp tips that are cone shaped or triangular in shape.

Figure 5:
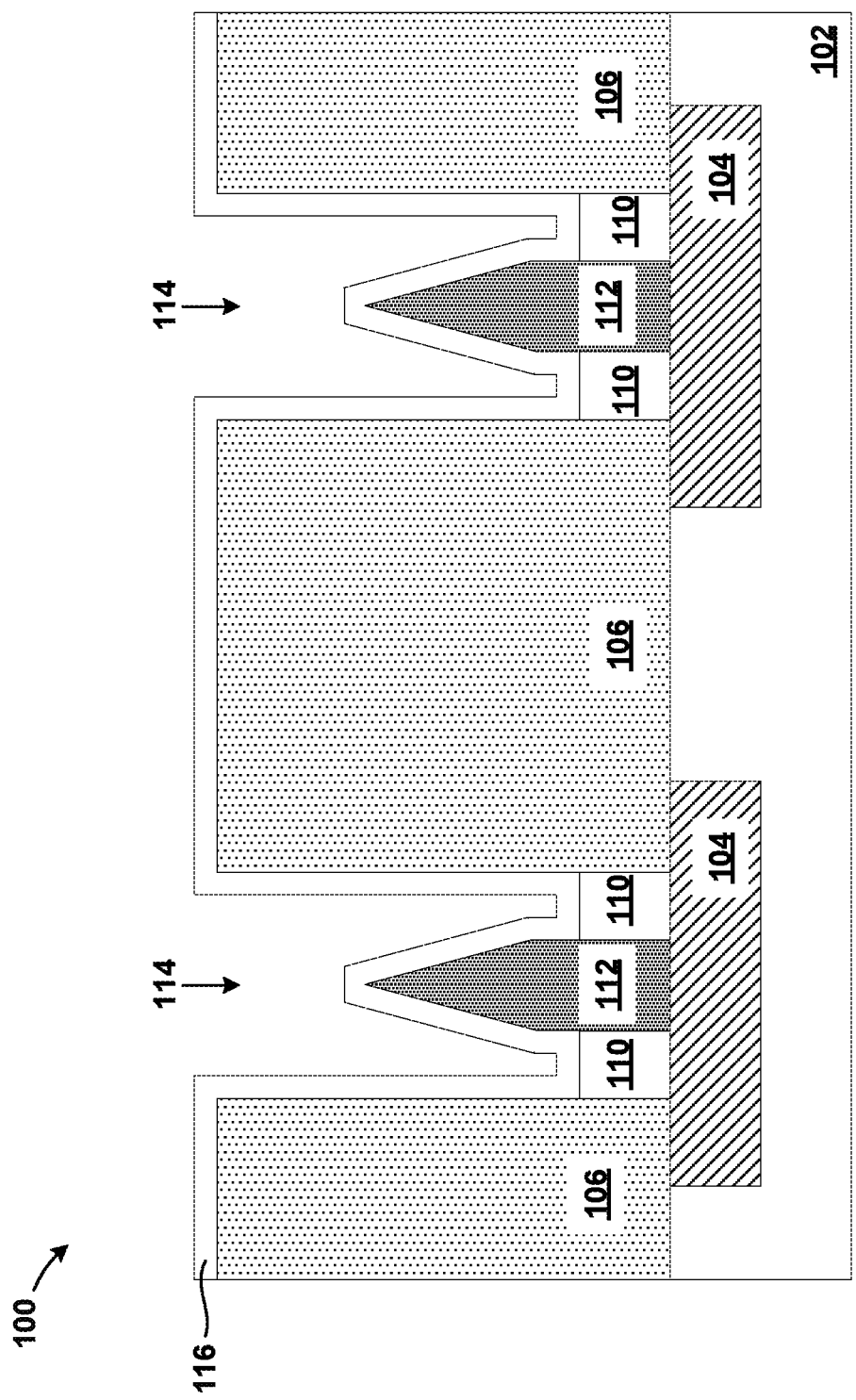
FIG. 5 is a cross section view illustrating depositing a liner according to an exemplary embodiment.

Referring now to FIG. 5, the structure 100 with a liner 116 is shown, in accordance with an embodiment. After the spacers 110 and the metal layers 112 are recessed to form the openings 114, the liner 116 is conformally deposited on to the structure 100, covering the top surfaces of the first dielectric layer 106, the spacers 110, and the metal layer 112. The liner 116 protects the sharp tips of the metal layer 112 from damage during subsequent processing of the structure 100. As such, the liner 116 is deposited to a thickness that allows for the liner to remain over the sharp tip of the metal layer 112 during subsequent etching of the structure 100. The liner 116 is deposited using know deposition techniques, such as, for example, atomic layer deposition.

The liner 116 may be made of a metal material. In addition, the liner 116 may be made of material that has a faster etch rate than the material forming the metal layers 112. For example, the liner 116 may be made of titanium carbide and the metal layers 112 may be made of titanium nitride. The etch rate of titanium carbide is 86.20 A/min whereas the etch rate of titanium nitride is 0.40 A/min using suitable wet etch chemistry. The difference in etch rates of the materials allows for the structure 100 to undergo subsequent etch processes without damaging the sharp tip of the metal layer 112.

Figure 6:
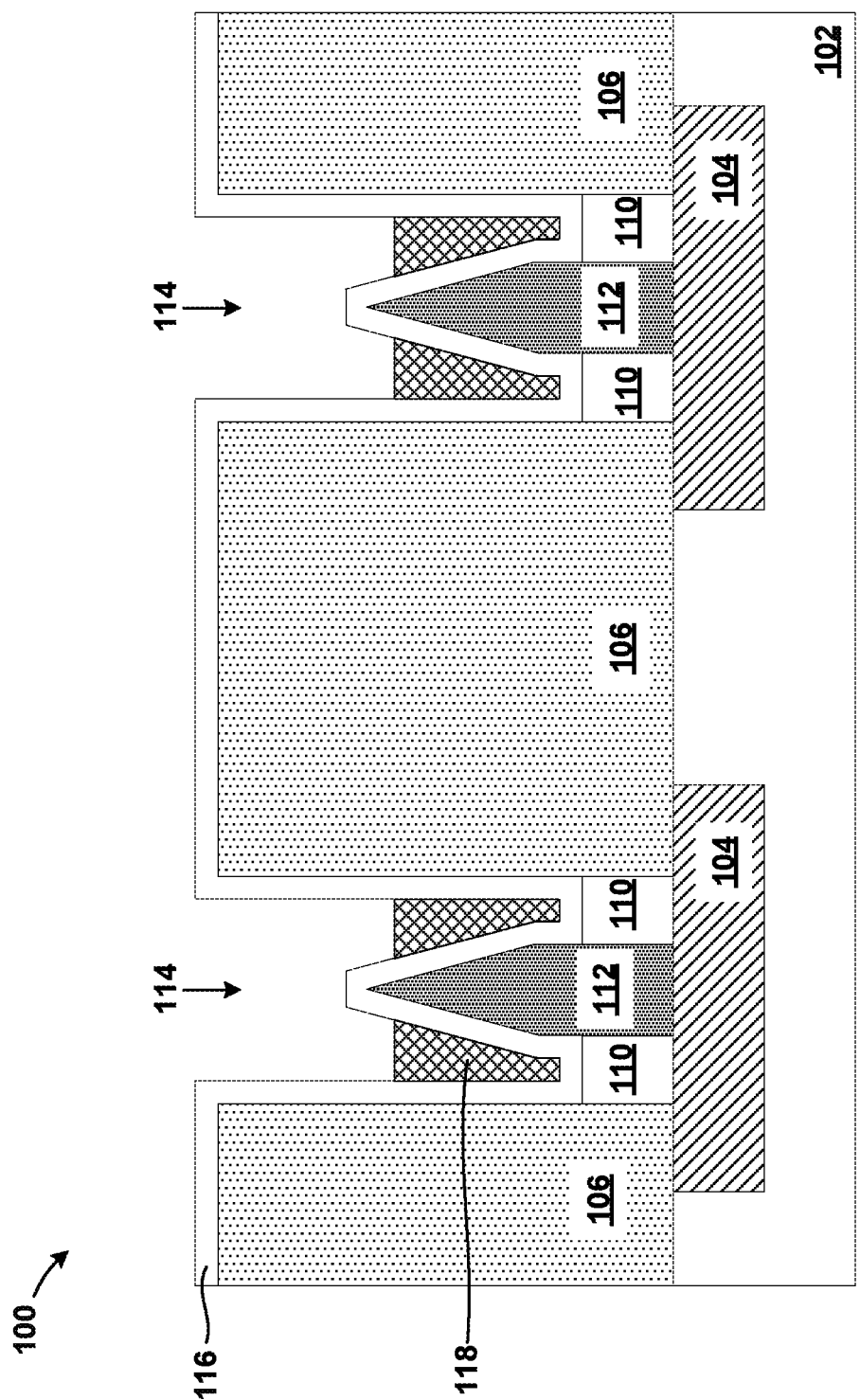
FIG. 6 is a cross section view illustrating depositing a second dielectric material according to an exemplary embodiment.

Referring now to FIG. 6, the structure 100 with a second layer 118 is shown, in accordance with an embodiment. The second layer 118 can be a dielectric layer. The second dielectric layer 118 is conformally deposited into the openings 114, on top of the liner 116. The second dielectric layer 118 is deposited so that the second dielectric layer 118 fills the bottom of the openings 114. The second dielectric layer 118 may be made of any suitable dielectric material, such as, for example, silicon oxide ($SiO_2$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the second dielectric layer 118.

The second dielectric layer 118 is deposited such that the top of the liner 116 within the opening 114 is covered by the second dielectric layer 118. The structure 100 then undergoes an isotropic etch process during which the second dielectric layer 118 is recessed such that the top surface of the second dielectric layer 118 is below the tip of the metal layer 112. In addition, the etching of the second dielectric layer 118 does not etch the liner 116 surrounding the sharp tip of the metal layer 112. The liner 116 is thick enough that during the etching of the second dielectric layer 118, the liner 116 does not get etched. Rather, the liner 116 surrounds the sharp tip of the metal layer 112, protecting the metal layer 112 during the etch process.

Figure 7:
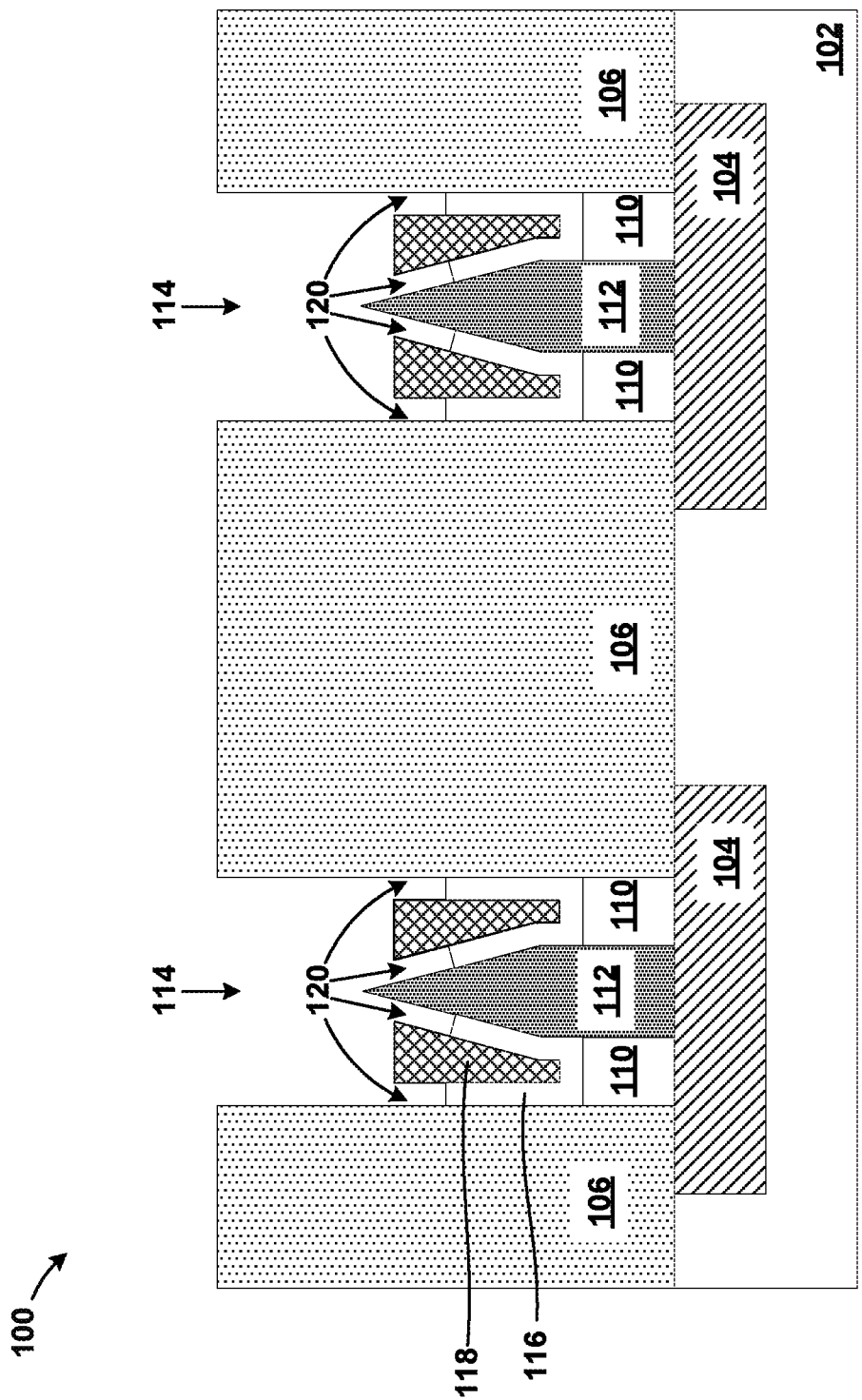
FIG. 7 is a cross section view illustrating selective recessing of the liner according to an exemplary embodiment.

Referring now to FIG. 7, the structure 100 with the liner 116 recessed back is shown, in accordance with an embodiment. After the second dielectric layer 118 is recessed, the structure 100 undergoes an isotropic etch process to remove portions of the liner 116. The etch process removes the liner 116 from the top surfaces of the first dielectric layer 106. As a result, only the bottom portion of the second dielectric layer 118 is surrounded by the liner 116. The etch process also recesses the liner 116 within the openings 114 such that portions of the sidewalls of the metal layer 112 and the second dielectric layer 118 are exposed, creating channels 120. In addition to partially exposing the sidewalls of the metal layer 112 and the sidewalls of the second dielectric layer 118, the etch process also exposes the sharp tip of the metal layer 112.

The channels 120 are formed between the second dielectric layers 118 and the metal layer 112. The channels 120 are also formed between the second dielectric layers 118 and the first dielectric layer 106.

During the recessing process of the liner 116, the metal layer 112 and the second dielectric layer 118 remain substantially unaffected. Since the liner 116 is made from different material than the metal layer 112 and the second dielectric layer 118, the liner 116 has a different etch rate that the metal layer 112 and the second dielectric layer 118. The difference in the etch rates of the materials allows for the liner 116 to be recessed without recessing the metal layers 112 and the second dielectric layer 118.

Figure 8:
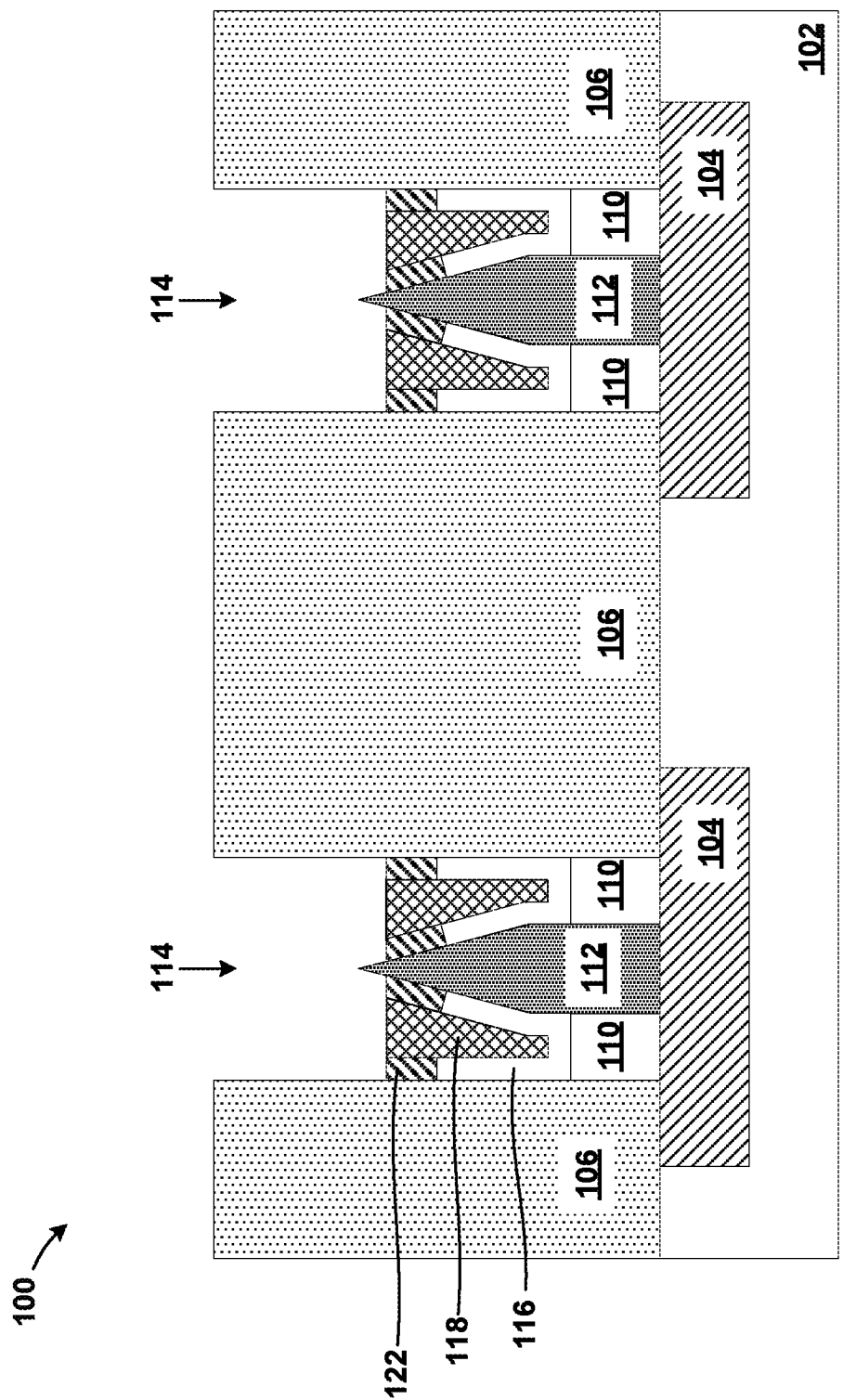
FIG. 8 is a cross section view illustrating depositing a third dielectric material according to an exemplary embodiment.

Referring now to FIG. 8, the structure 100 with a third dielectric layer 122 is shown, in accordance with an embodiment. The third dielectric layer 122 may be made of any suitable dielectric material, such as, for example, silicon nitride, silicon based low-k dielectrics, or porous dielectrics. Known suitable deposition techniques, such as, for example, atomic layer deposition, chemical vapor deposition, or physical vapor deposition may be used to form the third dielectric layer 122. The third dielectric layer 122 is made of materials that have low thermal conductivity. As a result, the third dielectric layer 122 function as an insulator, allowing the current to be contained within the metal layers 112.

The third dielectric layer 122 is conformally deposited to fill the channels (illustrated in FIG. 7) between the metal layer 112 and the second dielectric layers 118 and the channels between the second dielectric layers 118 and the first dielectric layers 106. Further, the third dielectric layer 122 is deposited such that the third dielectric layer 122 covers the metal layer 112. An etch process, such as, for example, an isotropic etch process may then be used to recess the third dielectric layer 122, exposing the sharp tip of the metal layer 112. The bottom most portion of the metal layer 112 is surrounded by the spacer 110, the middle portion of the metal layer 112 is surrounded by the liner 116, and most of the top portion of the metal layer 112 is surrounded by the third dielectric layer 122. As such, most of the metal layer 112 is surrounded by insulating material. Only the sharp cone shaped tip of the metal layer 112 is exposed.

The third dielectric layer 122 may be made of material that has a different etch rate than the second dielectric layer 118 and the metal layer 112. This allows for the third dielectric layer 122 to be removed or recessed without removing the other layers. As a result, when the third dielectric layer 122 is recessed, the second dielectric layer 118 and the metal layer 112 remain unchanged. The third dielectric layer 122 is recessed such that the top surface of the third dielectric layer 112 is substantially flush with the top surface of the second dielectric layer 118. The third dielectric layer 112 surrounds the top portions of the second dielectric layer 118.

Figure 9:
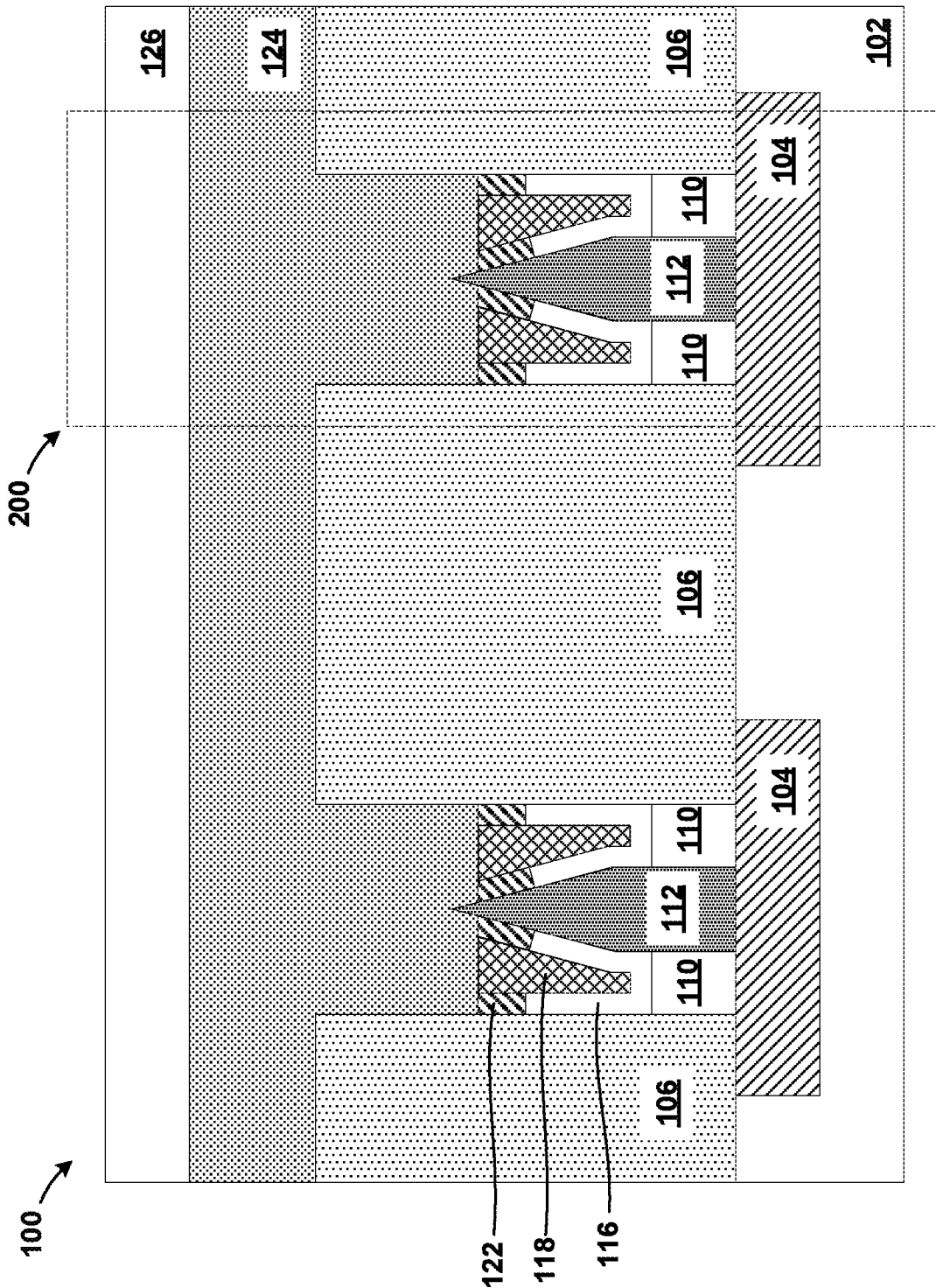
FIG. 9 is a cross section view illustrating depositing a phase change material and a top electrode according to an exemplary embodiment.

Referring now to FIG. 9, the structure 100 with a phase change memory layer 124 and a top electrode 126 is shown, in accordance with an embodiment. Conventional deposition processes, such as electroplating, electroless plating, chemical vapor deposition, physical vapor deposition, or a combination of methods, can be used to deposit the phase change material layer 124 onto the top portion of the structure 100.

The phase change material layer 124 may be formed from a mixture of Gallium (Ga) and Antimony (Sb) and at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb). It is to be appreciated that the preceding list is merely illustrative and, thus, other elements can also be used to form the phase change material, while maintaining the spirit of the present principles. In an embodiment, the phase change material may be made of a chalcogenide alloy such as germanium-antimony-tellurium (GST).

The phase change material may also be made of a transition metal oxide having multiple resistance states. For example, the phase change material may be made of at least one material selected from the group consisting of NiO, TiO2, HfO, Nb2O5, ZnO, WO3, and CoO or GST (Ge2Sb2Te5) or PCMO (PrxCa1-xMnO3). In an embodiment, the phase change material may be a chemical compound including one or more elements selected from the group consisting of sulfur (S), selenium (Se), tellurium (Te), arsenic (As), antimony (Sb), germanium (Ge), tin (Sn), indium (In), and silver (Ag).

The phase change material layer 124 is deposited such that the phase change material layer 124 fills the openings (illustrated in FIG. 8). In addition, the phase change material layer 124 is also deposited onto the top surfaces of the first dielectric layer 106. As a result, the bottom surface of the phase change material layer 124 is in direct contact with the top surface of the first dielectric layer 106, the second dielectric layer 118, the third dielectric layer 122, and the sharp metal tip of the metal layer 112. Since the bottom portion of the metal layer 112 is surrounded by the spacer 110, and the top portion of the metal layer 112 is surrounded by the liner 116 and the third dielectric layer, the heat generated by the bottom electrode 104 is concentrated to the metal layer 112.

Further, the bottom surface of the phase change material layer 124 contacts the top surface of the metal layer 112 at the sharp tip of the metal layer 112. Such a small contact area allows for more heat to be generated at the sharp tip of the metal layer 112 due to the fact that resistance is highest at that sharp tip of the metal layer 112.

The top electrode 126 is deposited on top of the phase change material layer 124 to allow for the current to pass from the bottom electrodes 104, through the metal layer 112, to the phase change material layer 124. The top electrode 126 is in direct contact with the phase change material layer 124. The top electrode 126 may be made from substantially the same conductive material as the bottom electrode 104, such as, for example, titanium nitride, copper, tungsten, or aluminum.

Once the top electrode 126 is layered on top of the phase change material layer 124, a phase change memory (PCM) cell 200 (shown by dashed lines) is formed. The PCM cell 200 includes the underlayer 102, the bottom electrode 104, the liner 116, the second dielectric layer 118, the third dielectric layer 122, the phase change material layer 124 and the top electrode 126.

In an embodiment, the current may flow between the bottom electrode 104 and the top electrode 126 allowing for the current to pass through the metal layer 112 to reach the phase change material layer 124. The heat generated by the current passing through the metal layer 112 heats the phase change material layer 124 around the sharp tip of the metal layer 112. The current required to change the phase change material layer 124 from the crystalline state to the amorphous state depends on the size of the top surface of the metal layer 112. That is, the smaller the top surface of the metal layer 112, the less current required to change the phase change material layer 124 from the crystalline state to the amorphous state. Therefore, it is advantageous to configure the metal layer 112 to have a minimal top surface without compromising the integrity of the metal layer 112.

Embodiments of the present invention described above illustrate a method and structure for forming the PCM cell 200 with the metal layer 112 that has a sharp metal tip whose top surface goes beyond current lithography techniques. Embodiments of the present invention provide a solution by reducing the size of the top surface of the metal layer 112 thereby reducing the current needed to heat the phase change material layer 124.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a metal layer, wherein a top portion of the metal layer is a cone shaped tip;
   a liner partially formed at a sidewall of the metal layer, a top surface of the liner is below a top surface of the cone shaped tip;
   a third dielectric layer, the third dielectric layer is above the liner, a top surface of the third dielectric layer is below the top surface of the cone shaped tip of the metal layer; and
   a phase change memory layer, wherein the cone shaped tip of the metal layer is in direct contact with the phase change memory layer.

2. The structure of claim 1, further comprising:
   a second dielectric layer, a top portion of the second dielectric layer is surrounded by the third dielectric layer and a bottom portion of the second dielectric layer is surrounded by the liner.

3. The structure of claim 1, further comprising:
   a first electrode below and in electrical contact with the metal layer; and
   a second electrode above and in electrical contact with the phase change memory layer.

4. The structure of claim 1, further comprising a spacer, the spacer surrounding a bottom portion of the metal liner, wherein the spacer has a different etch rate than the metal layer.

5. The structure of claim 1, further comprising:
   a second dielectric layer, a top portion of the second dielectric layer is surrounded by the third dielectric layer and a bottom portion of the second dielectric layer is surrounded by the liner, wherein the second dielectric layer has a different etch rate than the liner.

6. A structure comprising:
   a metal layer, wherein a top portion of the metal layer is a cone shaped tip;
   a liner partially formed at a sidewall of the metal layer, a top surface of the liner is below a top surface of the cone shaped tip of the metal layer;
   a second dielectric layer, a top surface of the second dielectric layer is below the cone shaped tip of the metal layer;
   a third dielectric layer, the third dielectric layer is above the liner, a top surface of the third dielectric layer is below the top surface of the cone shaped tip of the metal layer; and
   a phase change memory layer, wherein the cone shaped tip of the metal layer is in direct contact with the phase change memory layer.

7. The structure of claim 6, wherein a top portion of the second dielectric layer is surrounded by the third dielectric layer and a bottom portion of the second dielectric layer is surrounded by the liner.

8. The structure of claim 6, further comprising:
   a first electrode below and in electrical contact with the metal layer; and
   a second electrode above and in electrical contact with the phase change memory layer.

9. The structure of claim 6, further comprising a spacer, the spacer surrounding a bottom portion of the metal liner, wherein the spacer has a different etch rate than the metal layer.

10. The structure of claim 6, wherein a top portion of the second dielectric layer is surrounded by the third dielectric layer and a bottom portion of the second dielectric layer is surrounded by the liner, wherein the second dielectric layer has a different etch rate than the liner.

11. A structure comprising:
    a metal layer, wherein a top portion of the metal layer is a cone shaped tip, wherein the top portion of the metal layer has a smaller circumferential diameter than a bottom portion of the metal layer;
    a liner partially formed at a sidewall of the metal layer, a top surface of the liner is below a top surface of the cone shaped tip;
    a second dielectric layer, a top surface of the second dielectric layer is below the cone shaped tip of the metal layer;
    a third dielectric layer, the third dielectric layer is above the liner, a top surface of the third dielectric layer is below the top surface of the cone shaped tip of the metal layer; and
    a phase change memory layer, wherein the cone shaped tip of the metal layer is in direct contact with the phase change memory layer.

12. The structure of claim 11, wherein a top portion of the second dielectric layer is surrounded by the third dielectric layer and a bottom portion of the second dielectric layer is surrounded by the liner.

13. The structure of claim 11, further comprising:
    a first electrode below and in electrical contact with the metal layer; and
    a second electrode above and in electrical contact with the phase change memory layer.

14. The structure of claim 11, further comprising a spacer, the spacer surrounding a bottom portion of the metal liner, wherein the spacer has a different etch rate than the metal layer.

15. The structure of claim 11, wherein a top portion of the second dielectric layer is surrounded by the third dielectric layer and a bottom portion of the second dielectric layer is surrounded by the liner, wherein the second dielectric layer has a different etch rate than the liner.

* * * * *